(12) United States Patent
Ferris

(10) Patent No.: US 10,469,082 B2
(45) Date of Patent: Nov. 5, 2019

(54) ENCAPSULATED MAGNET POSITION SWITCH

(71) Applicant: GM Global Technology Operations LLC, Detroit, MI (US)

(72) Inventor: Ryan Ferris, Commerce Township, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 507 days.

(21) Appl. No.: 15/370,541

(22) Filed: Dec. 6, 2016

(65) Prior Publication Data

US 2018/0159535 A1    Jun. 7, 2018

(51) Int. Cl.
H03K 17/97    (2006.01)

(52) U.S. Cl.
CPC .................... *H03K 17/97* (2013.01)

(58) Field of Classification Search
CPC ........... H03K 17/97; H03K 2017/9713; H01H 35/02; H01H 35/14; H01H 36/00; H01H 1/14; H01H 1/16; H01H 36/0013
USPC ......................................... 335/205–207, 154
See application file for complete search history.

(56) References Cited

U.S. PATENT DOCUMENTS

| | | | | |
|---|---|---|---|---|
| 3,108,252 A * | 10/1963 | Torres | .................... | H01H 35/06 188/1.11 E |
| 3,446,063 A * | 5/1969 | Wintriss | .................... | G01L 3/24 100/99 |
| 5,136,126 A * | 8/1992 | Blair | ...................... | H01H 35/02 200/61.45 R |
| 5,209,343 A * | 5/1993 | Romano | ................ | H01H 35/02 200/61.45 R |
| 6,518,523 B1 * | 2/2003 | Chou | ................... | H01H 35/141 200/61.45 R |
| 2014/0263700 A1 * | 9/2014 | Hedger | ................. | B05B 7/0483 239/8 |

* cited by examiner

*Primary Examiner* — Bernard Rojas

(57) ABSTRACT

An encapsulated magnet position switch includes a non-magnetic tubular body including a first end wall closing a first end of the tubular body and an oppositely positioned second end wall closing a second end of the tubular body. Multiple equally angularly spaced non-magnetic guide rails are connected to an inner wall of the tubular body between the first end wall and the second end wall. A spherical shaped magnetic ball is positioned within the tubular body and is retained between the first end wall and the second end wall. The magnetic ball is longitudinally guided by the multiple guide rails coaxial to a longitudinal axis of the tubular body. Multiple sensors are positioned along the tubular body and are connected to a Hall effect switch, the sensors sensing and signaling a longitudinal position of the magnetic ball within the tubular body.

20 Claims, 4 Drawing Sheets

ENCAPSULATED MAGNET POSITION SWITCH

INTRODUCTION

The present disclosure relates to position monitors used to identify valve positions for automobile transmissions.

Present valve position monitors used to identify the valve positions for automatic transmissions require a two-part assembly having a magnet attached to a valve stem using for example a clip or fastener. The attachment between the magnet element and the stem allows the magnet to tilt as the magnet displaces longitudinally with longitudinal stem movement. Because the position of the magnet is sensed, any magnet tilt with respect to true longitudinal displacement can cause erroneous position indication of the magnet, and therefore an erroneous indication of the valve position.

Thus, while current valve position sensors achieve their intended purpose, there is a need for a new and improved system and device for determining a valve position of automatic transmission control valves.

SUMMARY

According to several aspects, an encapsulated magnet position switch includes a tubular body. Multiple guide rails are connected to an inner wall of the tubular body. A spherical shaped magnetic ball is positioned within the tubular body and is guided by the multiple guide rails coaxial to a longitudinal axis of the tubular body. Multiple sensors are positioned along the tubular body which are connected to a switch. The sensors sense and signal a position of the magnetic ball within the tubular body.

In an additional aspect of the present disclosure, the tubular body includes a first end wall closing a first end of the tubular body and an oppositely positioned second end wall closing a second end of the tubular body.

In another aspect of the present disclosure, the second end wall includes an aperture coaxially aligned with the longitudinal axis of the tubular body.

According to several aspects, a shaft defining a valve stem of a valve is slidably received within the aperture created in the second end wall and directly contacts the magnetic ball to displace the magnetic ball.

According to several aspects, a biasing member is positioned within the tubular body directly contacting the first end wall and contacting the magnetic ball.

According to several aspects, the biasing member normally biases the magnetic ball toward the second end wall.

According to several aspects, the switch defines a Hall effect switch.

According to several aspects, the multiple guide rails include three guide rails equally angularly positioned with respect to each other about an inner perimeter of the tubular body.

According to several aspects, the multiple guide rails are a non-magnetic metal material.

According to several aspects, the multiple guide rails are a non-magnetic polymeric material.

According to several aspects, the tubular body defines a non-magnetic material.

According to several aspects, a biasing member is positioned within the tubular body providing a biasing force acting to displace the magnetic ball.

According to several aspects, the biasing member directly contacts the magnetic ball.

According to several aspects, the biasing force of the biasing member acts coaxial to the longitudinal axis of the tubular body.

In another aspect of the present disclosure, an encapsulated magnet position switch includes a non-magnetic tubular body including a first end wall closing a first end of the tubular body and an oppositely positioned second end wall closing a second end of the tubular body. Multiple equally angularly spaced non-magnetic guide rails are connected to an inner wall of the tubular body between the first end wall and the second end wall. A spherical shaped magnetic ball is positioned within the tubular body and is retained between the first end wall and the second end wall. The magnetic ball is longitudinally guided by the multiple guide rails coaxial to a longitudinal axis of the tubular body. Multiple sensors are positioned along the tubular body connected to a Hall effect switch, the sensors sensing and signaling a longitudinal position of the magnetic ball within the tubular body.

According to several aspects, a biasing member is positioned within the tubular body directly contacting the first end wall and contacting the magnetic ball to bias the magnetic ball toward the second end wall.

According to several aspects, the multiple guide rails define a polymeric material.

According to several aspects, the multiple guide rails define a metal material.

According to several aspects, the second end wall includes an aperture coaxially aligned with the longitudinal axis of the tubular body. The aperture slidably receives a shaft defining a valve stem of a valve. The shaft directly contacts the magnetic ball to displace the magnetic ball.

According to several aspects, an encapsulated magnet position switch includes a tubular body including a first end wall closing a first end of the tubular body and an oppositely positioned second end wall closing a second end of the tubular body. Multiple guide rails are connected to an inner wall of the tubular body between the first end wall and the second end wall. A spherical shaped magnetic ball is positioned within the tubular body between the first end wall and the second end wall, and is guided by the multiple guide rails coaxial to a longitudinal axis of the tubular body. Multiple sensors are positioned along the tubular body and are connected to a switch. The sensors sense and signal a position of the magnetic ball within the tubular body to the switch. A biasing member is positioned within the tubular body directly contacting the first end wall and contacting the magnetic ball. An aperture is created in the second end wall slidably receiving a shaft defining a valve stem of a valve. The shaft directly contacts the magnetic ball to longitudinally displace the magnetic ball against a biasing force of the biasing member.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
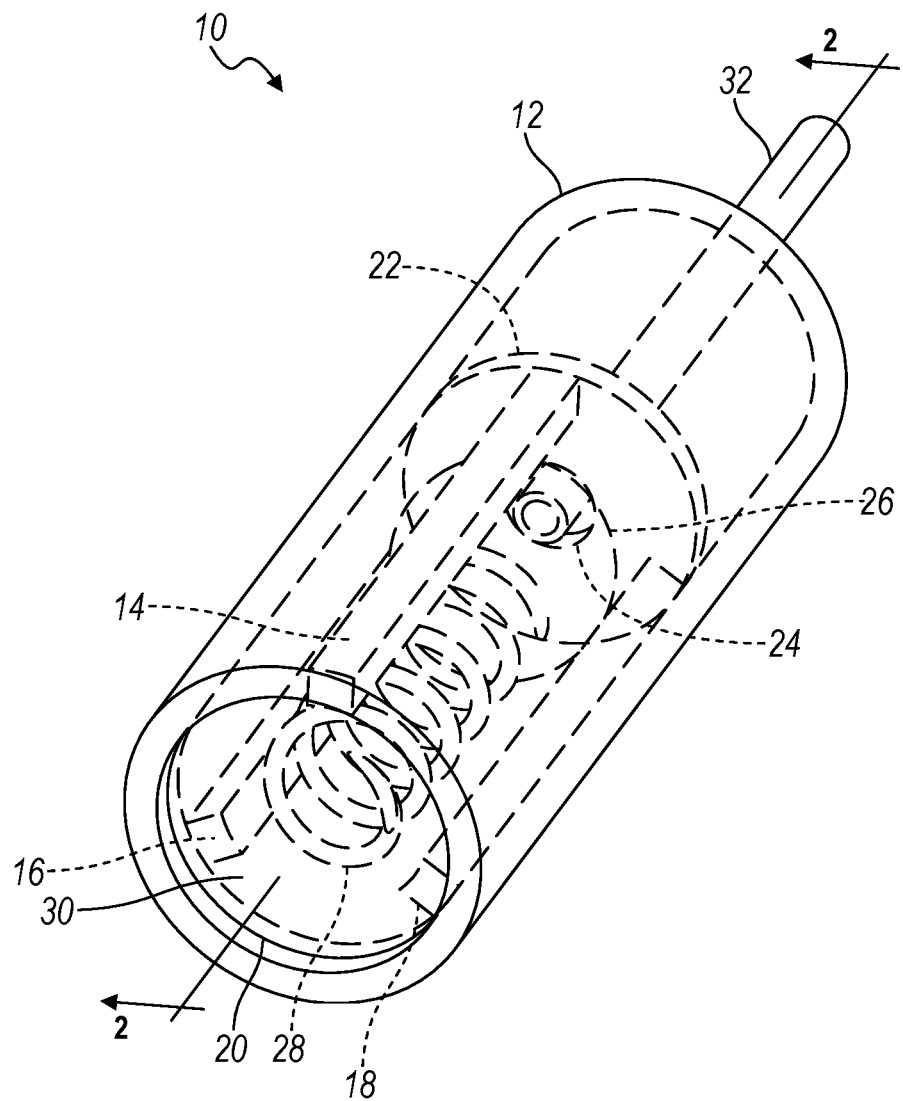
FIG. 1 is a front left perspective view of an encapsulated magnet position switch according to an exemplary embodiment.

Referring to FIG. 1, an encapsulated magnet position switch 10 includes a tubular body 12 having a first guide rail 14, a second guide rail 16 and a third guide rail 18 positioned longitudinally along an inner wall of the tubular body 12. The first, second and third guide rails 14, 16, 18 are equally spaced from each other, and therefore are positioned at intervals of approximately 120 degrees. A first end wall 20 closes a first end of the tubular body 12, and a second end wall 22 closes a second end of the tubular body 12. A spherical shaped magnetic ball 26 is positioned within the tubular body 12 and when longitudinally displaced within the tubular body 12 is guided and supported by contact with the first, second and third guide rails 14, 16, 18.

A biasing member 28 such as a compression spring and the magnetic ball 26 are positioned within a cavity 30 defined within the tubular body 12 and normally biases the magnetic ball 26 in a first direction "A". A biasing force of the biasing member 28 acts coaxial to a longitudinal axis of the tubular body 12 shown and described in greater detail in reference to FIGS. 4-5. The magnetic ball 26 can displace by sliding or rolling contact along the first, second and third guide rails 14, 16, 18. To minimize resistance of motion of the magnetic ball 26, the first, second and third guide rails 14, 16, 18 are made of a non-magnetic material such as aluminum, or a non-magnetic polymeric material providing a low coefficient of friction during displacement of the magnetic ball 26.

Referring to FIG. 2 and again to FIG. 1, the biasing member 28 contacts both the first end wall 20 and the magnetic ball 26, and normally biases the magnetic ball 26 into direct contact with the second end wall 22. The magnetic ball 26 can be any magnetized material such as a metal or a rare earth material. The magnetic ball 26 is captured within the cavity 30 between the first end wall 20 and the second end wall 22. An aperture 24 is created in the second end wall 22 providing access from outside the second end wall 22 to contact and displace the magnetic ball 26 as will be described in better detail in reference to FIG. 3.

Referring to FIG. 3 and again to FIGS. 1-2, the encapsulated magnet position switch 10 can be used in conjunction with a position sensing system 32 as follows. The magnetic ball 26 can be displaced in a second direction "B", opposite to the first direction "A" within the cavity 30 against the biasing force of the biasing member 28. One or more sensors are positioned along an outer wall 34 of the tubular body 12. In one exemplary aspect, the sensors include a first sensor 36 positioned proximate to the location of the magnetic ball 26 in its position abutting the second end wall 22 shown in FIG. 2. A second sensor 38 is positioned approximately midway between the first end wall 20 and the second end wall 22. A third sensor 40 is positioned proximate to a displaced position of the magnetic ball 26 when it is located proximate to the first end wall 20 as shown. The first, second and third sensors 36, 38, 40 are each connected to a Hall effect switch 42, which functions in accordance with the production of a voltage difference defined as the Hall voltage across an electrical conductor, acting transverse to an electric current in the conductor and a magnetic field perpendicular to the current.

A shaft 44 such as a valve stem displaced during transition from a vehicle running to a vehicle parked position of an automobile transmission extends into the aperture 24 created in the second end wall 22. As the shaft 44 is displaced in the second direction "B", for example when the transmission is changed to a park position, the shaft 44 directly contacts the magnetic ball 26 and displaces the magnetic ball 26 in the second direction "B". As the magnetic ball 26 moves, the magnetic field generated by the magnetic ball 26 will also move accordingly, and the position of the magnetic ball 26 within the cavity 30 can be measured using a Hall effect switch and sensors.

Figure 2:
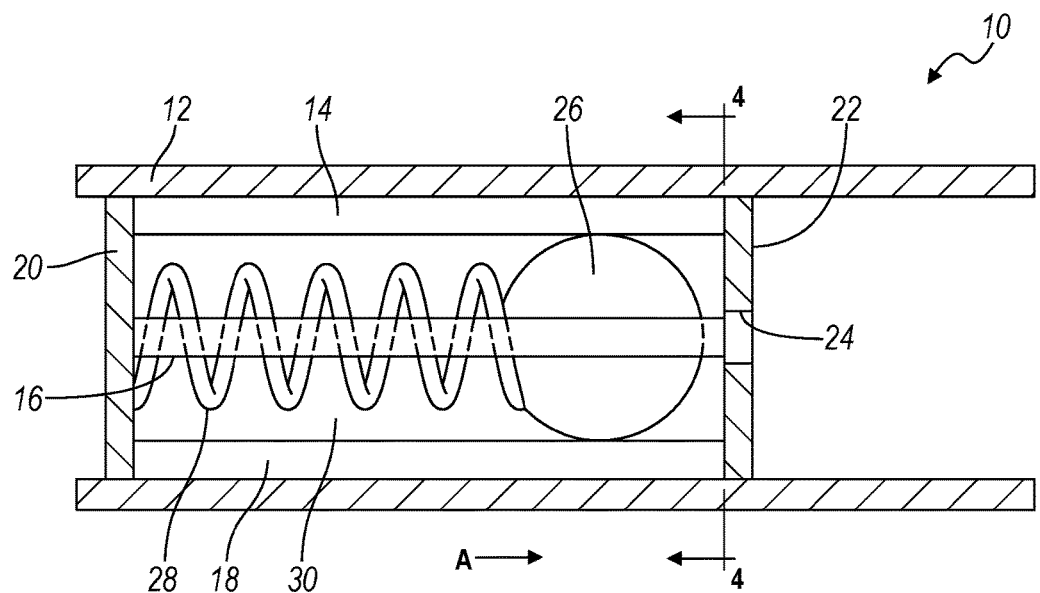
FIG. 2 is a cross sectional front elevation view taken at section 2 of FIG. 1.
Figure 3:
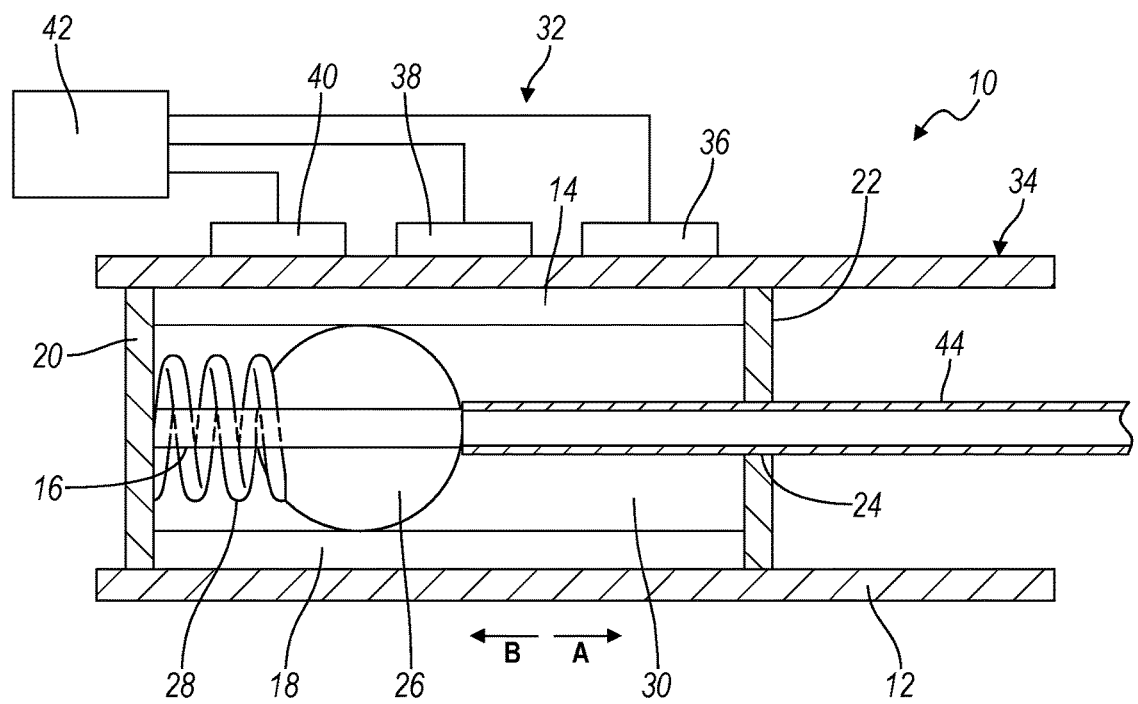
FIG. 3 is a cross sectional front elevation view modified from FIG. 2.

When the magnetic ball 26 is in the position shown in FIG. 2 directly contacting the second end wall 22, the magnetic field and therefore the position of the magnetic ball 26 is sensed by the most proximate sensor, the first sensor 36. As the magnetic ball 26 moves in the second direction "B" the biasing member 28 compresses, and as the magnetic ball 26 passes the second sensor 38, a second sensed position of the magnetic ball 26 in a mid-position is read at the Hall effect switch 42. As the magnetic ball 26 moves further in the second direction "B" the biasing member 28 further compresses, and as the magnetic ball 26 passes the third sensor 40, a third sensed position of the magnetic ball 26 in a displaced position is read at the Hall effect switch 42. Using a known displacement of the shaft 44, for example the known displacement between a transmission engaged position and a transmission park position, the signal generated by the third sensor 40 at the third sensed position of the magnetic ball 26 can be used as confirmation that the transmission has been placed in the park position.

If the shaft 44 is subsequently oppositely displaced in the first direction "A", the biasing force of the biasing member 28 will displace the magnetic ball 26 in the first direction "A". The sensed position of the magnetic ball 26 will change as its position relayed by the signals from the third sensor 40, the second sensor 38 and the first sensor 36 are received. When the magnetic ball 26 again contacts the second end wall 22, its position will be indicated by a signal from the first sensor 36.

Figure 4:
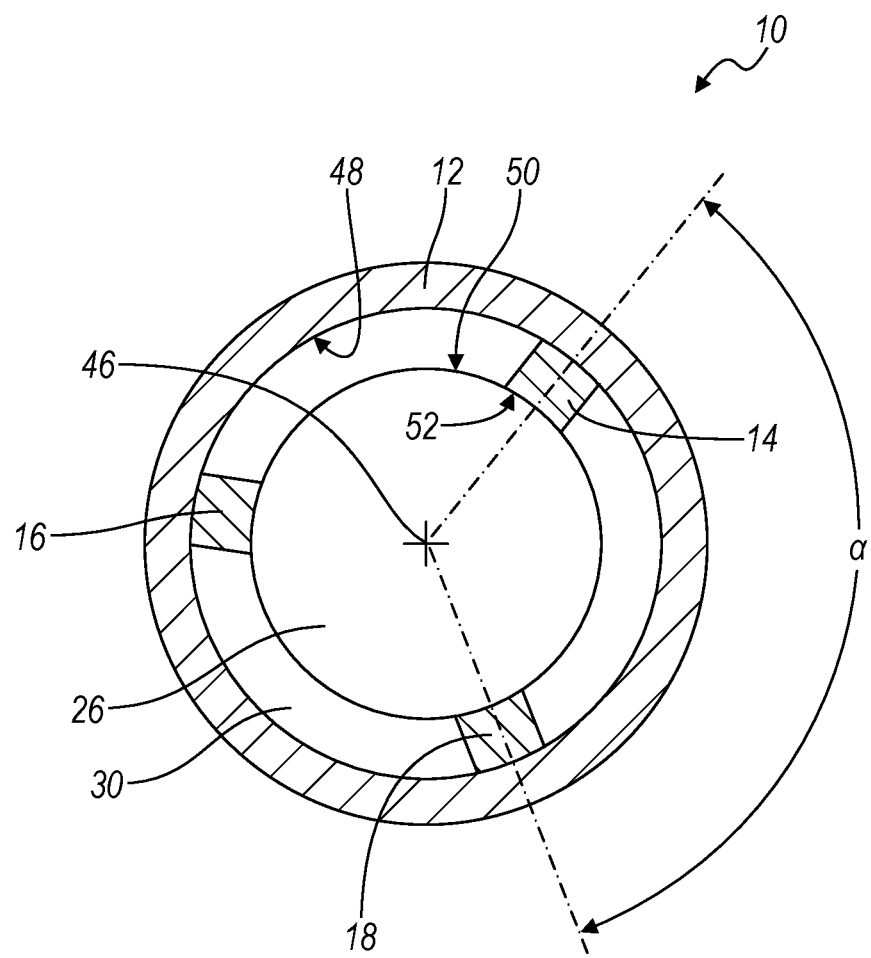
FIG. 4 is a cross sectional end elevational view taken at section 4 of FIG. 2.
Figure 5:
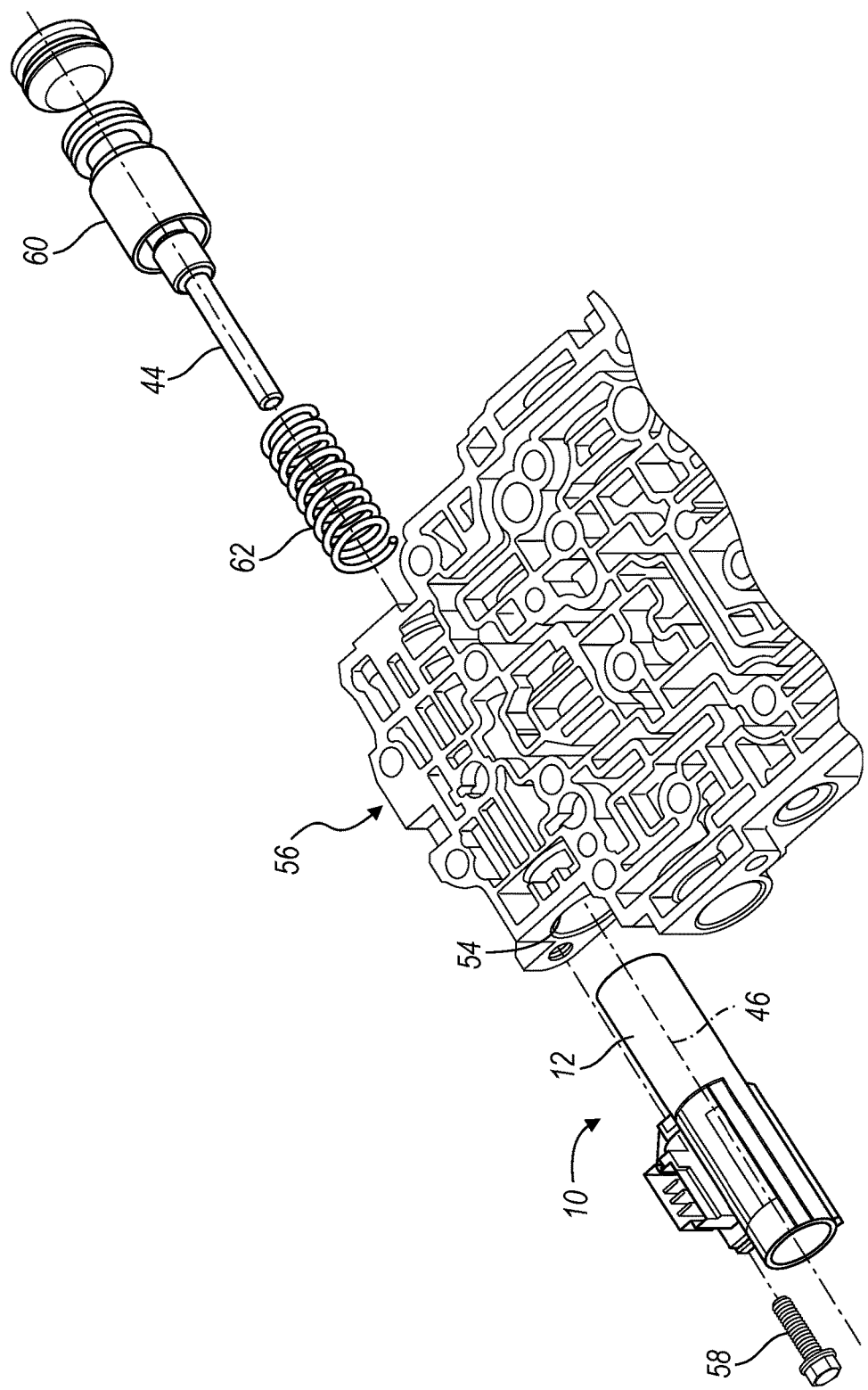
FIG. 5 is a front left perspective view of an encapsulated magnet position switch and a valve body according to an exemplary aspect.

Referring to FIG. 4, for accurate determination of the position of the magnetic ball 26 as it displaces within the cavity 30, it is preferable that the magnetic ball 26 travel along a path as close as possible to collinear with a longitudinal axis 46 of the tubular body 12. The use of at least three guide rails, including the first, second and third guide rails 14, 16, 18 supports the magnetic ball 26 along its travel path. Each successive one of the guide rails 14, 16, 18 is oriented at an equal angle alpha ($\alpha$) from another one of the guide rails. When three guide rails are used, angle $\alpha$ therefore equals 120 degrees. Each of the first, second and third guide rails 14, 16, 18 is fixed to an inner surface 48 of the tubular body 12. As a further example, if four guide rails are used, angle $\alpha$ will accordingly equal 90 degrees. An outer face 50 of the magnetic ball 26 directly contacts an inward face 52 of each of the first, second and third guide rails 14, 16, 18 along a substantial length of the first, second and third guide rails 14, 16, 18. The inward faces 52 of each of the first, second and third guide rails 14, 16, 18 are therefore oriented substantially parallel to each other. The inward faces 52 of each of the first, second and third guide rails 14, 16, 18 can be substantially planar, or can include a concave curvature corresponding to a convex curvature of the outer face 50 of the magnetic ball 26.

Referring to FIG. 5 and again to FIGS. 1-4, in an exemplary application of the encapsulated magnet position switch 10 the tubular body 12 is sized to be slidaby received in a through aperture 54 of a valve body 56 of an automobile transmission. The encapsulated magnet position switch 10 can be retained using a fastener 58 threadably engaged to the valve body 56. The shaft 44 defines a valve stem of a valve 60 extending into an opposite end of the through aperture 54 to be slidably received within the aperture 24 created in the second end wall 22 as described in reference to FIG. 3. A biasing member 62 such as a compression spring biases the valve 60 away from the encapsulated magnet position switch 10.

An encapsulated magnet position switch 10 of the present disclosure offers several advantages. These include elimination of a connector now used to connect the valve stem of known valves with a sensing device. Known connectors can allow the magnet to tilt as the magnet displaces longitudinally with longitudinal stem movement, causing erroneous position sensing. The shaft 44 of the encapsulated magnet position switch 10 is coaxially aligned with the longitudinal axis 46 of the tubular body 12, directly contacts the magnetic ball 26, and therefore does not include a connector at this junction. The spherical shaped magnetic ball 26 minimizes the potential for the axial position of the magnetic ball 26 along its path on the longitudinal axis 46 of the tubular body 12 within the tubular body 12 to create an erroneous valve position reading. The use of multiple guide rails 14, 16, 18 ensure the magnetic ball 26 does not bind or displace from the longitudinal axis 46 of the tubular body 12.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An encapsulated magnet position switch, comprising:
a tubular body;
multiple equally angularly spaced guide rails directly connected to an inner wall of the tubular body;
a spherical shaped magnetic ball positioned within the tubular body and guided by the multiple guide rails coaxial to a longitudinal axis of the tubular body; and
multiple sensors positioned along the tubular body connected to a switch, the sensors sensing and signaling a position of the magnetic ball within the tubular body.

2. The encapsulated magnet position switch of claim 1, wherein the tubular body includes a first end wall closing a first end of the tubular body and an oppositely positioned second end wall closing a second end of the tubular body.

3. The encapsulated magnet position switch of claim 2, wherein the second end wall includes an aperture coaxially aligned with the longitudinal axis of the tubular body.

4. The encapsulated magnet position switch of claim 3, further including a shaft defining a valve stem of a valve slidably received within the aperture created in the second end wall and directly contacting the magnetic ball to displace the magnetic ball.

5. The encapsulated magnet position switch of claim 2, further including a biasing member positioned within the tubular body directly contacting the first end wall and contacting the magnetic ball.

6. The encapsulated magnet position switch of claim 5, wherein the biasing member normally biases the magnetic ball toward the second end wall.

7. The encapsulated magnet position switch of claim 1, wherein the switch defines a Hall effect switch.

8. The encapsulated magnet position switch of claim 1, wherein the multiple guide rails include three guide rails equally angularly positioned with respect to each other about an inner perimeter of the tubular body.

9. The encapsulated magnet position switch of claim 1, wherein the multiple guide rails are a non-magnetic metal material.

10. The encapsulated magnet position switch of claim 1, wherein the multiple guide rails are a non-magnetic polymeric material.

11. The encapsulated magnet position switch of claim 1, wherein the tubular body defines a non-magnetic material.

12. The encapsulated magnet position switch of claim 1, further including a biasing member positioned within the tubular body providing a biasing force acting to displace the magnetic ball.

13. The encapsulated magnet position switch of claim 12, wherein the biasing member directly contacts the magnetic ball.

14. The encapsulated magnet position switch of claim 12, wherein the biasing force of the biasing member acts coaxial to the longitudinal axis of the tubular body.

15. An encapsulated magnet position switch, comprising:
a non-magnetic tubular body including a first end wall closing a first end of the tubular body and an oppositely positioned second end wall closing a second end of the tubular body;
multiple equally angularly spaced non-magnetic guide rails connected to an inner wall of the tubular body between the first end wall and the second end wall;
a spherical shaped magnetic ball positioned within the tubular body and retained between the first end wall and the second end wall, the magnetic ball longitudinally guided by the multiple guide rails coaxial to a longitudinal axis of the tubular body; and
multiple sensors positioned along the tubular body connected to a Hall effect switch, the sensors sensing and signaling a longitudinal position of the magnetic ball within the tubular body.

16. The encapsulated magnet position switch of claim 15, further including a biasing member positioned within the tubular body directly contacting the first end wall and contacting the magnetic ball to bias the magnetic ball toward the second end wall.

17. The encapsulated magnet position switch of claim 15, wherein the multiple guide rails define a polymeric material.

18. The encapsulated magnet position switch of claim 15, wherein the multiple guide rails define a metal material.

19. The encapsulated magnet position switch of claim 15, wherein the second end wall includes an aperture coaxially aligned with the longitudinal axis of the tubular body, the aperture slidably receiving a shaft defining a valve stem of a valve, the shaft directly contacting the magnetic ball to displace the magnetic ball.

20. An encapsulated magnet position switch, comprising:
a tubular body including a first end wall closing a first end of the tubular body and an oppositely positioned second end wall closing a second end of the tubular body;
multiple equally angularly spaced guide rails directly connected to an inner wall of the tubular body between the first end wall and the second end wall;

a spherical shaped magnetic ball positioned within the tubular body between the first end wall and the second end wall, and guided by the multiple guide rails coaxial to a longitudinal axis of the tubular body;

multiple sensors positioned along the tubular body connected to a switch, the sensors sensing and signaling a position of the magnetic ball within the tubular body to the switch;

a biasing member positioned within the tubular body directly contacting the first end wall and contacting the magnetic ball; and an aperture created in the second end wall slidably receiving a shaft defining a valve stem of a valve, the shaft directly contacting the magnetic ball to longitudinally displace the magnetic ball against a biasing force of the biasing member.

* * * * *